US008349076B2

United States Patent
Song et al.

(10) Patent No.: US 8,349,076 B2
(45) Date of Patent: *Jan. 8, 2013

(54) METHOD OF FABRICATING GAN SUBSTRATE

(75) Inventors: In-Jae Song, Yongin-si (KR); Jai-yong Han, Suwon-si (KR)

(73) Assignee: Samsung Corning Precision Materials Co., Ltd., Gumi-si (KR)

( * ) Notice: Subject to any disclaimer, the term of this patent is extended or adjusted under 35 U.S.C. 154(b) by 1038 days.

This patent is subject to a terminal disclaimer.

(21) Appl. No.: 11/545,518

(22) Filed: Oct. 11, 2006

(65) Prior Publication Data

US 2007/0082465 A1   Apr. 12, 2007

(30) Foreign Application Priority Data

Oct. 12, 2005   (KR) .................. 10-2005-0096167

(51) Int. Cl.
*C30B 25/00*   (2006.01)
(52) U.S. Cl. ............... 117/90; 117/84; 117/88; 117/89; 117/91; 117/93; 117/94; 117/95; 117/97; 117/99; 117/102; 117/105; 117/106; 117/952
(58) Field of Classification Search ............... 117/88, 117/89, 94, 95, 90, 97, 106, 81–87, 71, 93, 117/99, 102, 105, 952; 257/E21.119, E21.131, 257/E21.132; 438/604
See application file for complete search history.

(56) References Cited

U.S. PATENT DOCUMENTS 5,371,037 A * 12/1994 Yonehara .............. 438/459
5,374,581 A * 12/1994 Ichikawa et al. ............ 438/459
5,427,055 A * 6/1995 Ichikawa ................. 117/92
6,086,673 A * 7/2000 Molnar ................ 117/90

(Continued)

FOREIGN PATENT DOCUMENTS

JP   2003-178984   6/2003

OTHER PUBLICATIONS

Mynbarva et al., "Strain Relaxation in GaN layers grown on porous GaN sublayers." *MRS Internet Journal Nitride Semiconductor Research*, Res. 4, 14, 1999.,pp. 1-5.

(Continued)

*Primary Examiner* — Matthew Song
(74) *Attorney, Agent, or Firm* — Stein McEwen, LLP

(57) ABSTRACT

A method of fabricating a freestanding gallium nitride (GaN) substrate includes: preparing a GaN substrate within a reactor; supplying HCl and $NH_3$ gases into the reactor to treat the surface of the GaN substrate and forming a porous GaN layer; forming a GaN crystal growth layer on the porous GaN layer; and cooling the GaN substrate on which the GaN crystal growth layer has been formed and separating the GaN crystal growth layer from the substrate. According to the fabrication method, the entire process including forming a porous GaN layer and a thick GaN layer is performed in-situ within a single reactor. The method is significantly simplified compared to a conventional fabrication method. The fabrication method enables the entire process to be performed in one chamber while allowing GaN surface treatment and growth to be performed using HVPE process gases, thus resulting in a significant reduction in manufacturing costs. The fabrication method also allows self-separation of thick GaN without cracking, thus achieving a short process time and a high manufacturing yield.

24 Claims, 7 Drawing Sheets

U.S. PATENT DOCUMENTS

| | | | | |
|---|---|---|---|---|
| 6,197,683 | B1* | 3/2001 | Kang et al. | 438/643 |
| 6,380,108 | B1* | 4/2002 | Linthicum et al. | 438/791 |
| 6,413,627 | B1* | 7/2002 | Motoki et al. | 428/332 |
| 6,447,604 | B1* | 9/2002 | Flynn et al. | 117/89 |
| 6,468,347 | B1* | 10/2002 | Motoki et al. | 117/89 |
| 6,579,359 | B1* | 6/2003 | Mynbaeva et al. | 117/94 |
| 6,586,778 | B2* | 7/2003 | Linthicum et al. | 257/103 |
| 6,709,513 | B2* | 3/2004 | Fukunaga et al. | 117/90 |
| 6,924,159 | B2* | 8/2005 | Usui et al. | 438/22 |
| 7,118,934 | B2* | 10/2006 | Oshima et al. | 438/48 |
| 7,462,893 | B2* | 12/2008 | Han et al. | 257/200 |
| 7,998,272 | B2* | 8/2011 | Song | 117/81 |
| 2002/0074314 | A1* | 6/2002 | Bohn et al. | 216/56 |
| 2002/0078881 | A1* | 6/2002 | Cuomo et al. | 117/84 |
| 2002/0111044 | A1* | 8/2002 | Linthicum et al. | 438/797 |
| 2003/0114017 | A1* | 6/2003 | Wong et al. | 438/778 |
| 2004/0016396 | A1* | 1/2004 | Nagai et al. | 117/84 |
| 2004/0183090 | A1* | 9/2004 | Kitaoka et al. | 257/103 |
| 2004/0206967 | A1* | 10/2004 | Oshima et al. | 257/85 |
| 2005/0023544 | A1* | 2/2005 | Shibata | 257/94 |
| 2005/0093003 | A1* | 5/2005 | Shibata | 257/79 |
| 2005/0133798 | A1* | 6/2005 | Jung et al. | 257/79 |
| 2005/0139960 | A1* | 6/2005 | Shibata | 257/615 |
| 2005/0208687 | A1* | 9/2005 | Kasai et al. | 438/22 |
| 2006/0097353 | A1* | 5/2006 | Motoki et al. | 257/609 |
| 2006/0292879 | A1* | 12/2006 | Takayama et al. | 438/694 |
| 2007/0082465 | A1* | 4/2007 | Song et al. | 438/478 |
| 2007/0092980 | A1* | 4/2007 | Han et al. | 438/22 |
| 2007/0141813 | A1* | 6/2007 | Song | 438/483 |
| 2007/0152353 | A1* | 7/2007 | Park | 257/E33.001 |
| 2008/0280140 | A1* | 11/2008 | Ferrari et al. | 428/402 |
| 2008/0296586 | A1* | 12/2008 | Francis et al. | 257/77 |

OTHER PUBLICATIONS

Li et al., "In-plane bandgap control in porous GaN through electroless wet chemical etching." *Applied Physics Letters*. vol. 80, No. 6, Feb. 11, 2002, pp. 980-982.

Oshima et al., "Fabrication of Freestanding GaN Wafers by Hydride Vapor-Phase Epitaxy with Void-Assisted Separation." *Phys. Stat. Sol.* (a) 194 No. 2, 2002, pp. 554-558.

Oshima et al., "Preparation of Freestanding GaN Wafers by Hydride Vapor Phase Epitaxy with Void-Assisted Separation." *Applied Physics Letters*. vol. 42, No. 1A/B, 2003, pp. L1-L3.

U.S. Appl. No. 11/545,520, filed Oct. 11, 2006, Jai-Yong Han et al., Samsung Electronics Co., Ltd.

U.S. Appl. No. 11/598,568, filed Nov. 14, 2006, In-Jae Song, Samsung Electronics Co., Ltd.

Japanese Office Action dated Feb. 28, 2012, issued in corresponding Japanese Patent Application No. 2006-273738.

* cited by examiner

GaN(~10μm) GROWTH ON SAPPHIRE

In-situ HCl TREATMENT

THICK GaN GROWTH

COOLING & SEPARATION

FREESTANDING GaN

COOLING & SEPARATION

FREESTANDING GaN

METHOD OF FABRICATING GAN SUBSTRATE

CROSS-REFERENCE TO RELATED APPLICATIONS

This application claims the benefit of Korean Patent Application No. 2005-96167, filed on Oct. 12, 2005, in the Korean Intellectual Property Office, the disclosure of which is incorporated herein in its entirety by reference.

BACKGROUND OF THE INVENTION

1. Field of the Invention

Aspects of the present invention relate to a method of fabricating a gallium nitride (GaN) substrate, and more particularly, to a method of fabricating a freestanding GaN substrate that includes treating a substrate surface to form a porous GaN layer.

2. Description of the Related Art

Various methods have been proposed for fabricating a GaN substrate to be used as a substrate for blue and UV light-emitting devices. Most conventional GaN substrate fabrication methods include forming porous GaN on a SiC or sapphire substrate, growing thick GaN, and lifting off the thick GaN using a UV laser to obtain freestanding GaN.

Mynbaeva et al. present a method of growing GaN on a SiC substrate. The method uses a HF solution under ultraviolet light excitation to form porous GaN. This method requires a separate wet etching process in addition to a film formation process, thus necessitating an additional cleaning process (Strain relaxation in GaN Layers grown on porous GaN sublayers (MRS Internet J. Nitride Semicond. Res. 4, 14(1999))).

Xiuling Li et al. proposes a method of forming porous GaN by metal-assisted electroless wet etching using metal such as Pt. This method is also a complicated process that requires separate metal layer formation and etching processes (In-plane bandgap control in porous GaN through electroless wet chemical etching (Volume 80, Number 6, 11 Feb. 2002, Applied Physics Letters)).

Meanwhile, various methods for separating thick GaN being grown on a different substrate as described above have been proposed. One approach to separating GaN from a sapphire substrate is to use a UV laser such that the substrate is heated to about 1,000° C. The conventional lift-off process using UV light and heat requires a long time. The lift-off process may also cause breakage of the GaN layer due to thermal imbalance.

Yuichi Oshima et al. proposes a void assisted separation (VAS) technique (Preparation of Freestanding GaN Wafers by Hydride Vapor Phase Epitaxy with Void-Assisted Separation (Jpn. J. Appl. Phys. Vol. 42 (2003) pp. L1-L3 Part 2, No. 1A/B, 15 Jan. 2003)). According to the VAS method, a thick GaN is formed on a GaN template substrate with an ex-situ TiN nanonet formed thereon to achieve easy separation of porous GaN. The method may provide high quality freestanding GaN but it is an expensive and complicated process that adds a risk of metal contamination.

SUMMARY OF THE INVENTION

Aspects of the present invention provide a simple, low-cost method of manufacturing a freestanding gallium nitride (GaN) substrate that can achieve a high manufacturing yield.

Aspects of the present invention also provide a method of manufacturing a freestanding GaN substrate using a single process.

According to an aspect of the present invention, there is provided a method of fabricating a freestanding gallium nitride (GaN) substrate, including: preparing a GaN substrate layer within a reactor; supplying HCl and $NH_3$ gases into the reactor to treat the surface of the GaN substrate layer and forming a porous GaN layer in the GaN substrate layer; forming a GaN crystal growth layer on the porous GaN layer; and cooling the GaN substrate layer on which the porous GaN layer and the GaN crystal growth layer are formed and separating the GaN crystal growth layer from the GaN porous layer and GaN substrate layer to provide the freestanding substrate.

The preparing of the GaN substrate includes loading a semiconductor substrate into the reactor and forming a GaN layer on the semiconductor substrate. The semiconductor substrate may be a sapphire, SiC, or GaN substrate.

According to another embodiment of the present invention, there is provided a method of fabricating a freestanding gallium nitride (GaN) substrate, the method comprising: loading a GaN wafer into a reactor; supplying HCl and $NH_3$ gases into the reactor to treat a surface of the GaN wafer and forming a porous GaN layer in the GaN wafer; forming a GaN crystal growth layer on the porous GaN layer; and cooling the GaN wafer on which the porous GaN layer and GaN crystal growth layer are formed such that the GaN crystal growth layer separates from the GaN wafer and GaN porous layer to provide the freestanding GaN substrate Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
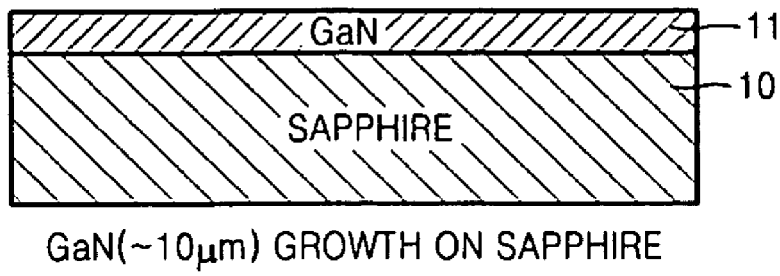
FIGS. 1A-1F illustrate a method of manufacturing gallium nitride (GaN) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Referring to FIG. 1A, a semiconductor substrate 10, such as, for example, a sapphire substrate with a GaN layer 11 on a top surface thereof, is prepared. Although the semiconductor substrate 10 is described as a sapphire substrate, the semiconductor substrate 10 may also be any suitable material, such as, for example, a GaN or SiC substrate. For example, the substrate 10 may be a starting substrate for growth of a crystal layer. After the substrate 10 is loaded into a reactor of a hydride vapor phase epitaxy (HVPE) system, GaCl and $NH_3$ gases are supplied as source gases along with an $N_2$ carrier gas to form the GaN layer 11 on the substrate 10. Alternatively, the GaN layer 11 may be formed on the substrate 10 using Metal-Organic Chemical Vapor Deposition (MOCVD).

Figure 1B:
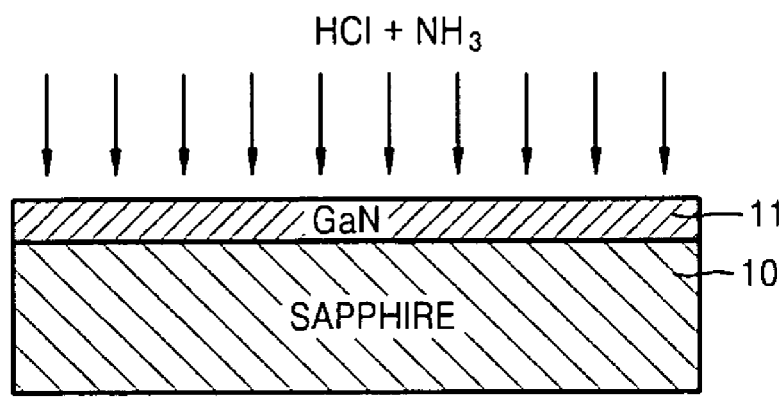
Figure 1C:
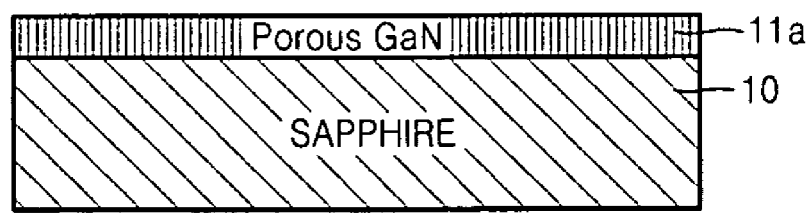

As illustrated in FIG. 1B, after completing the growth of the GaN layer 11, HCl and $NH_3$ gases are injected into the reactor to treat the surface of the GaN layer 11 in-situ. Referring to FIG. 1C, after the surface treatment, a porous GaN layer 11a is formed on the substrate 10. The surface treatment will be described in more detail later.

Figure 1D:
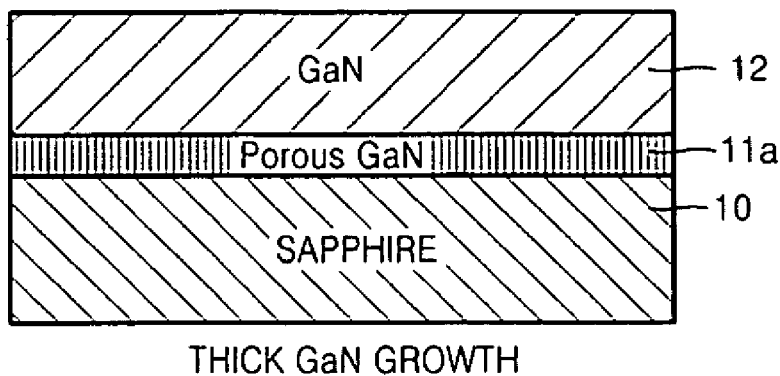

As illustrated in FIG. 1D, a thick GaN crystal is then grown in-situ within the reactor. To accomplish this, Ga and N source gases are supplied to form a thick GaN crystal growth layer 12 on the porous GaN layer 11a using a common method.

Figure 1E:
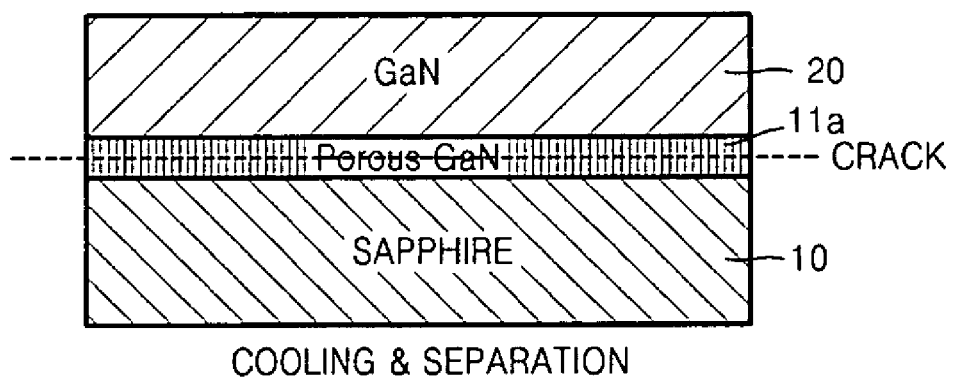
Figure 1F:
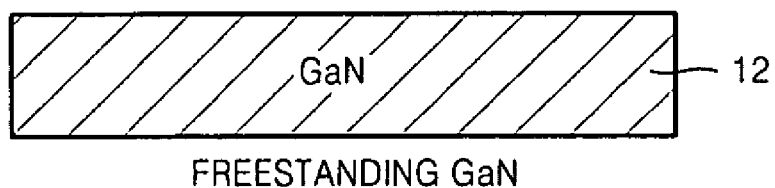

Referring to FIG. 1E, the substrate 10 is then cooled within the reactor. The cooling may be natural cooling. In other words, the cooling can be carried out by ceasing to apply heat to the reactor such that the reactor cools naturally to room temperature. However, other methods of cooling may be used. During the cooling, the porous GaN layer 11a may crack or fracture, allowing the thick GaN crystal growth layer 12 to separated easily from the substrate 10 after cooling. Referring to FIG. 1F, the separated GaN crystal growth layer 12 is available for use as a freestanding GaN substrate in the manufacturing of a semiconductor device. The separated GaN crystal growth layer 12 may then be subjected to polishing as in a typical process. For example, if an irregular surface is present on the separated GaN crystal growth layer 12 where the GaN crystal growth layer 12 was attached to the substrate 10 through the porous GaN layer 11a, due, for example, to the presence of some material from the porous GaN layer remaining on the surface of the GaN crystal growth layer, such an irregular surface can be smoothed by polishing.

FIGS. 2A-2F illustrate a method of manufacturing a freestanding GaN substrate according to another embodiment of the present invention. In the embodiment according to FIGS. 2A-2F, a GaN wafer is used as the starting substrate for forming the thick GaN crystal growth layer that becomes the freestanding GaN substrate. Except for the difference in the starting substrate, the method illustrated in FIGS. 2A-2F may be carried out with the same operations and conditions as the method illustrated in FIGS. 1A-1F.

Figure 2A:
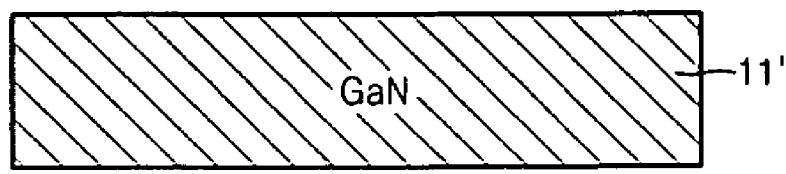
FIGS. 2A-2F illustrate a method of manufacturing GaN according to another embodiment of the present invention.
Figure 2B:
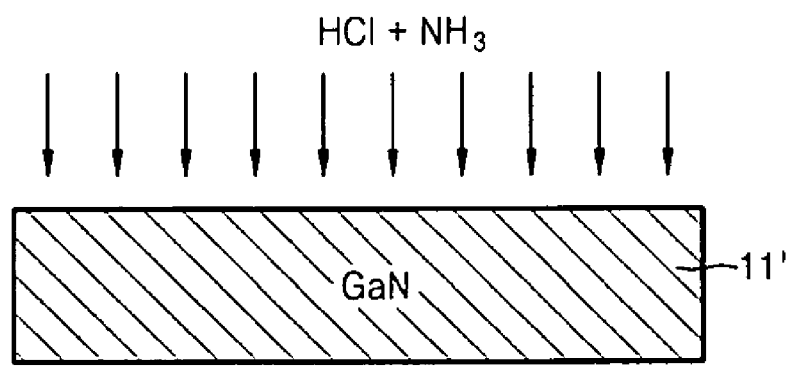
Figure 2C:
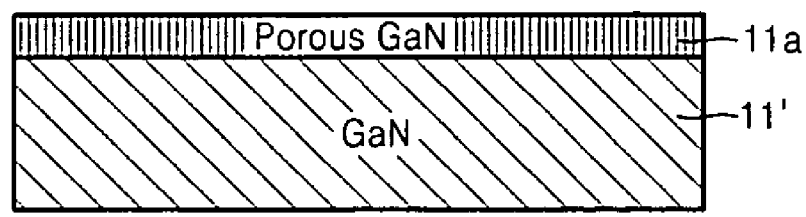

Referring to FIG. 2A, a GaN wafer 11' is loaded into a reactor of an HVPE system. As illustrated in FIG. 2B, HCl and $NH_3$ gases are injected into the reactor to treat the surface of the GaN wafer 11'. Referring to FIG. 2C, after the surface treatment, a porous GaN layer 11a is formed on the GaN wafer 11'.

Figure 2D:
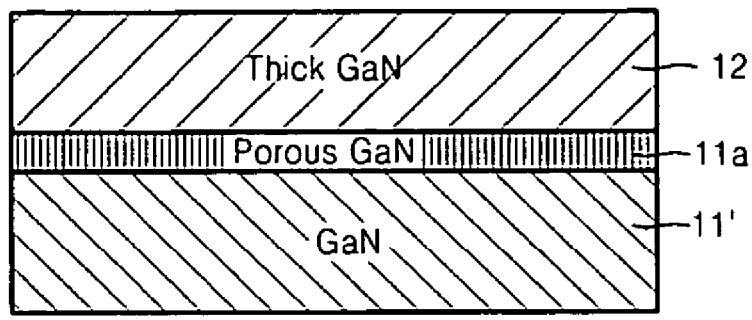

As illustrated in FIG. 2D, a source for the growth of GaN crystal is supplied into the reactor to form a thick GaN crystal growth layer 12 on the porous GaN layer 11a.

Figure 2E:
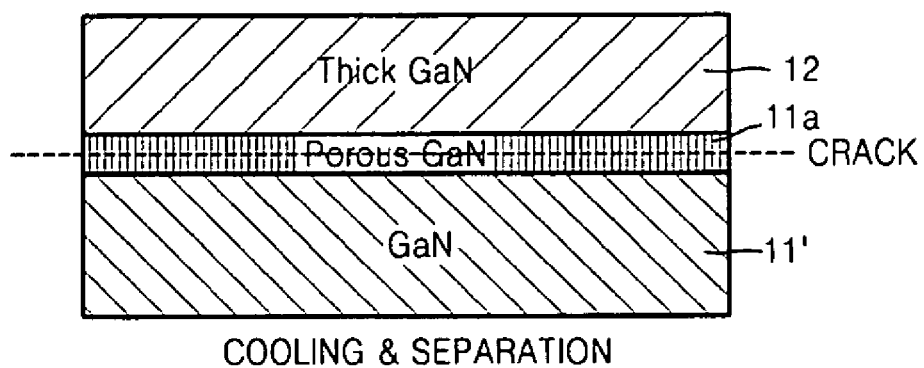
Figure 2F:
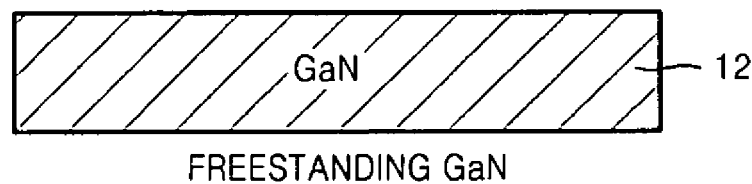

Referring to FIG. 2E, the GaN wafer 11' having the porous GaN layer 11a and the thick GaN crystal growth layer 12 formed thereon is cooled within the reactor. After cooling, the GaN crystal growth layer 12 is separated from the GaN wafer 11' and the porous GaN layer 11a. Referring to FIG. 2F, the separated GaN crystal growth layer 12 is available for use as a freestanding GaN substrate in the manufacturing of a semiconductor device. The separated GaN crystal growth layer 12 may then be subjected to polishing.

As described in the above two embodiments, the porous GaN layer 11a is formed on a semiconductor substrate such as a GaN wafer or sapphire substrate. The HVPE system is used during this process, and the porous GaN layer and the thick GaN crystal growth layer are grown successively in-situ within the HVPE system.

Conditions for forming the porous GaN will now be described. A vertical HVPE system is used for surface treatment of a GaN wafer or GaN layer. That is, after the reactor of the HVPE system is heated to 900° C. to 1,200° C., such as, for example, to 1,000° C., source gases needed for surface treatment of GaN are supplied into the chamber along with an $N_2$ carrier gas for several minutes.

Figure 3:
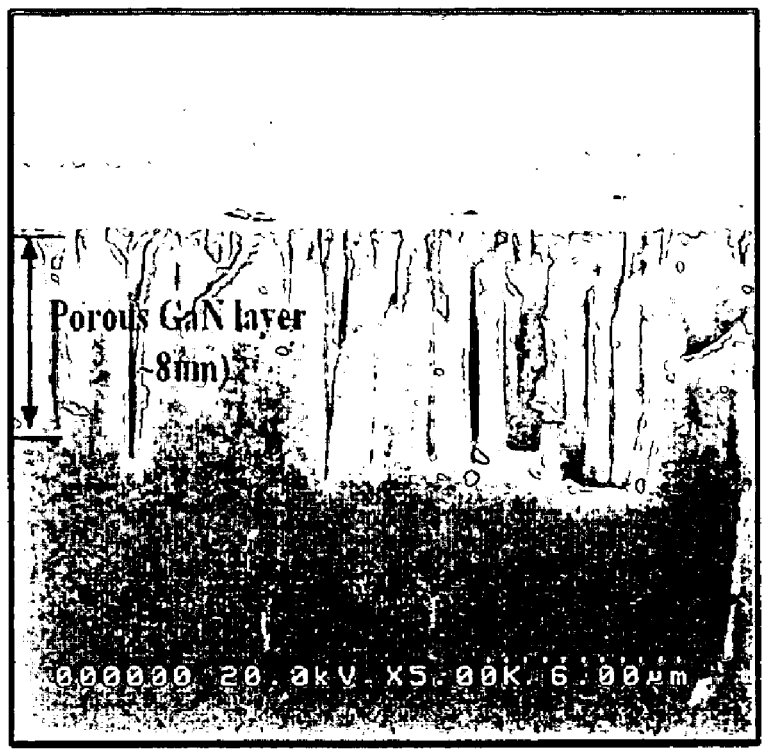
FIG. 3 is a representation of a scanning electron microscope (SEM) image of a porous GaN layer fabricated according to the method illustrated in FIGS. 2A-2F.

The source gases are HCl and $NH_3$ gases, which are supplied at 50 to 150 sccm and 500 to 1,500 sccm, respectively. For example, the HCl and $NH_3$ gases may be supplied at 100 sccm and 1,000 sccm, respectively, and $N_2$ carrier gas may be supplied at about 8,000 sccm at an atmospheric pressure. After the source gases and carrier gas are supplied, GaN decomposes into Ga at the surface of the GaN wafer or GaN layer to generate and discharge GaCl and $H_2$ gases, thus creating voids having a predetermined depth on the surface of the GaN layer or GaN wafer, thereby forming a porous GaN layer of predetermined thickness. FIG. 3 represents a scanning electron microscope (SEM) image of a porous GaN layer obtained on a GaN wafer as a result of the surface treatment. As illustrated in FIG. 3, the porous GaN layer has a thickness of about 8 um and is well formed on the GaN wafer.

Following the formation of the porous GaN layer, Ga and N gases are supplied appropriately into the chamber in which surface treatment for forming the porous GaN layer was performed, so that a thick GaN crystal growth layer is grown on the porous GaN layer. The thick GaN crystal growth layer may be formed while the reactor of the HVPE system remains heated at the same temperature used for forming the porous GaN layer (for example, 900° C. to 1,200° C.) or at any other suitable temperature.

Figure 4A:
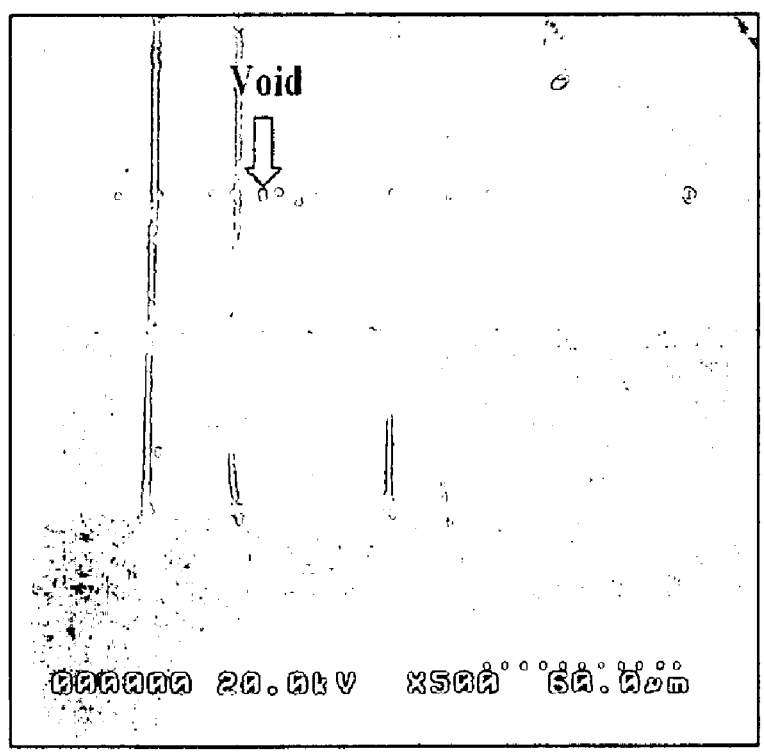
FIG. 4A is a representation of an SEM image of porous GaN/thick GaN layer fabricated according to the method illustrated in FIGS. 2A-2F.
Figure 4B:
FIG. 4B is a representation of an enlarged SEM image of the porous GaN layer shown in FIG. 4A.
Figure 4C:
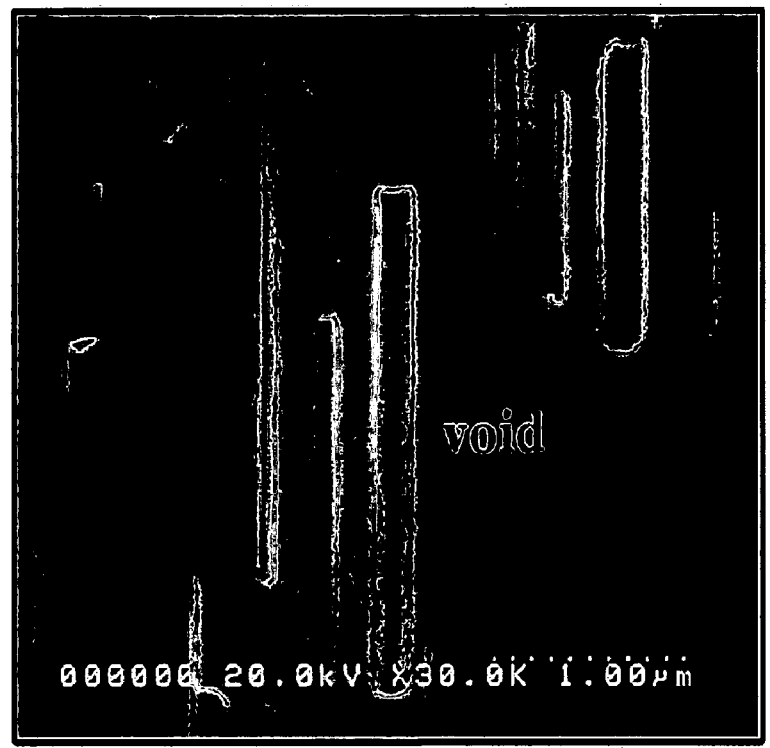
FIG. 4C is a representation of an enlarged SEM image of the dotted rectangular portion shown in FIG. 4B.

FIG. 4A represents an SEM image of a sample having a thick GaN crystal growth layer formed on a porous GaN layer. The porous GaN layer is indicated by the arrow. FIG. 4B represents an enlarged SEM image of the porous GaN layer shown in FIG. 4A. The bright band in the middle of the image indicates the porous GaN layer, which has a thickness of about 7 um. FIG. 4C represents an enlarged SEM image of the dotted rectangular portion of FIG. 4B. As evident from FIG. 4C, a void is well formed in the porous GaN layer.

Figure 5:
FIG. 5 is a representation of an image of a freestanding GaN substrate fabricated according to the method illustrated in FIGS. 2A-2F.

The thick GaN crystal growth layer overlying the porous GaN layer self-separates from the starting substrate 10 or 10' after cooling. What is meant by "self-separates" is that it is typically not necessary to apply force or heat or laser energy to effect the separation of the GaN crystal growth layer from the starting substrate. The stress that the material experiences while cooling is typically enough by itself to cause cracks or fractures in the porous GaN layer to allow the GaN crystal growth layer and the starting substrate to separate. However, a slight amount of force separately exerted on the GaN crystal growth layer may be helpful in separating the GaN substrate. FIG. 5 represents a freestanding GaN substrate that has self-separated after cooling.

According to aspects of the present invention, the entire process including forming a porous GaN layer and a thick GaN crystal growth layer is performed in-situ within a single reactor, and after cooling, the thick GaN crystal growth layer self-separates without cracking. (In other words, the porous GaN layer cracks or fractures during cooling and separation, but the GaN crystal growth layer itself does not). The method of fabricating a freestanding GaN substrate is greatly simplified compared to conventional fabrication methods. The fabrication method according to aspects of the present invention allows the entire process to be performed in one chamber. In particular, according to the fabrication method, GaN surface treatment and growth is performed using HVPE process gases, thus resulting in a significant reduction in manufacturing costs. The fabrication method according to aspects of the present invention also allows self-separation of thick GaN crystal growth layers without cracking, thus achieving a short process time and a high manufacturing yield.

Aspects of the present invention can be applied to the fabrication of large-scale GaN freestanding substrates, and in particular, to the economical fabrication of freestanding GaN substrates having a thickness greater than several microns.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a freestanding gallium nitride (GaN) substrate, the method comprising:
  preparing a GaN substrate layer within a reactor;
  supplying HCl and $NH_3$ gases and $N_2$ carrier gas into the reactor and using the HCl and $NH_3$ gases to treat a surface of the GaN substrate layer and to form a porous GaN layer in the GaN substrate layer; forming a GaN crystal growth layer directly on the porous GaN layer; and
  naturally in the reactor, cooling to room temperature the GaN substrate layer on which the porous GaN layer and the GaN crystal growth layer are formed, thereby separating the GaN crystal growth layer from the GaN substrate layer and GaN porous layer to provide the freestanding GaN substrate,
  wherein the preparing of the GaN substrate layer comprises loading a semiconductor substrate into the reactor and forming the GaN substrate layer on the semiconductor substrate.

2. The method of claim 1, wherein the semiconductor substrate is one of sapphire, SiC, and GaN substrates.

3. The method of claim 2, wherein the HCl, $NH_3$ and $N_2$ gases are supplied into the reactor at 50 to 150 sccm, 500 to 1,500 sccm, and 8,000 sccm, respectively, at atmospheric pressure.

4. The method of claim 1, wherein the forming of the porous GaN layer is performed at a temperature of 900° C. to 1,200° C.

5. The method of claim 4, wherein the HCl, $NH_3$ and $N_2$ gases are supplied into the reactor at 50 to 150 sccm, 500 to 1,500 sccm, and 8,000 sccm, respectively, at atmospheric pressure.

6. The method of claim 1, wherein the forming of the porous GaN layer and the forming of the GaN crystal growth layer are carried out at an elevated temperature and wherein the cooling is carried out by allowing the GaN substrate layer on which the porous GaN layer and the GaN crystal growth layer are formed to cool naturally to room temperature.

7. The method of claim 6, wherein the HCl, $NH_3$ and $N_2$ gases are supplied at 50 to 150 sccm, 500 to 1,500 sccm, and 8,000 sccm, respectively, at atmospheric pressure.

8. The method of claim 1, wherein the reactor is a reactor of an HVPE (Hydride Vapor Phase Epitaxy) system.

9. The method of claim 1, wherein the HCl, $NH_3$ and $N_2$ gases are supplied into the reactor at 50 to 150 sccm, 500 to 1,500 sccm, and 8,000 sccm, respectively, at atmospheric pressure.

10. The method of claim 1, wherein the porous GaN layer is formed by supplying HCl and $NH_3$ gases such that GaN at the surface of the GaN substrate layer decomposes to generate and discharge GaCl and $H_2$ gases to create voids on the surface of the GaN substrate layer.

11. The method of claim 10, wherein the voids are created in the GaN substrate layer to have a pre-determined depth, thereby providing the porous GaN layer with a pre-determined thickness.

12. The method of claim 1, wherein the preparing of a GaN substrate layer; the supplying to HCl and $NH_3$ gases to treat the surface of the GaN substrate layer, the forming of the porous GaN layer in the GaN substrate layer; the forming of the GaN crystal growth layer on the porous GaN layer; the cooling of the GaN substrate layer on which the porous GaN layer and the GaN crystal growth layer are formed and the separating of the GaN crystal growth layer from the GaN substrate layer and GaN porous layer to provide the freestanding GaN substrate are carried out in a single reactor.

13. The method of claim 1, wherein the cooling of the GaN substrate layer on which the porous GaN layer and the GaN crystal growth layer are formed is carried out such that the porous GaN layer fractures to allow the GaN crystal growth layer to be separated.

14. The method of claim 1, further including polishing the freestanding GaN substrate.

15. A method of fabricating a freestanding gallium nitride (GaN) substrate, the method comprising:
  loading a starting GaN wafer into a reactor;
  supplying HCl and $NH_3$ gases and $N_2$ carrier gas into the reactor and using the HCl and $NH_3$ gases to treat a surface of the GaN wafer and to form a porous GaN layer to a predetermined thickness at the surface of the GaN wafer;
  forming a GaN crystal growth layer directly on the porous GaN layer; and
  in the reactor, cooling to room temperature the GaN wafer on which the porous GaN layer and GaN crystal growth layer are formed such that the GaN crystal growth layer separates from the GaN wafer and GaN porous layer to provide the freestanding GaN substrate.

16. The method of claim 15, wherein the forming of the porous GaN layer is performed at a temperature of 900° C. to 1,200° C.

17. The method of claim 15, wherein the reactor is a reactor of an HVPE (Hydride Vapor Phase Epitaxy) system.

18. The method of claim 15, wherein the forming of the porous GaN layer and the forming of the GaN crystal growth layer are carried out at an elevated temperature and wherein the cooling is carried out by allowing the GaN wafer on which the porous GaN layer and the GaN crystal growth layer are formed to cool naturally to room temperature.

19. The method of claim 15, wherein the HCl, $NH_3$ and $N_2$ gases are supplied into the reactor at 50 to 150 sccm, 500 to 1,500 sccm, and 8,000 sccm, respectively, at atmospheric pressure.

20. The method of claim 15, wherein the porous GaN layer is formed by supplying HCl and $NH_3$ gases such that GaN at the surface of the GaN substrate layer decomposes to generate and discharge GaCl and $H_2$ gases to create voids on the surface of the GaN substrate layer.

21. The method of claim 20, wherein the voids are created in the GaN substrate layer to have a pre-determined depth, thereby providing the porous GaN layer with the pre-determined thickness.

22. The method of claim 15, wherein the preparing of a GaN substrate layer; the supplying to HCl and $NH_3$ gases to treat the surface of the GaN substrate layer, the forming of the porous GaN layer in the GaN substrate layer; the forming of the GaN crystal growth layer on the porous GaN layer; the cooling of the GaN substrate layer on which the porous GaN layer and the GaN crystal growth layer are formed and the separating of the GaN crystal growth layer from the GaN substrate layer and GaN porous layer to provide the freestanding GaN substrate are carried out in a single reactor.

23. The method of claim 15, wherein the cooling of the GaN wafer on which the porous GaN layer and the GaN crystal growth layer are formed is carried out such that the porous GaN layer fractures to allow the GaN crystal growth layer to be separated.

24. The method of claim 15, further comprising polishing the freestanding GaN substrate.

* * * * *